(12) United States Patent
Matsuura (10) Patent No.: US 7,363,648 B2
(45) Date of Patent: Apr. 22, 2008

(54) CABLE MODEM TUNER

(75) Inventor: Syuuji Matsuura, Ikoma (JP)

(73) Assignee: Sharp Kabushiki Kaisha, Osaka-shi, Osaka (JP)

( * ) Notice: Subject to any disclaimer, the term of this patent is extended or adjusted under 35 U.S.C. 154(b) by 1152 days.

(21) Appl. No.: 09/782,257

(22) Filed: Feb. 14, 2001

(65) Prior Publication Data

US 2001/0016950 A1 Aug. 23, 2001

(30) Foreign Application Priority Data

Feb. 14, 2000 (JP) .............................. 2000-035072
Mar. 17, 2000 (JP) .............................. 2000-076125

(51) Int. Cl.
H04N 7/173 (2006.01)
H04L 12/66 (2006.01)
H03B 21/00 (2006.01)
H03D 1/24 (2006.01)

(52) U.S. Cl. .......................... 725/111; 370/463; 331/42; 331/43; 375/320

(58) Field of Classification Search ................ 725/111, 725/120, 131, 139, 151; 455/313, 314, 323; 331/48, 74, 185; 375/324, 327, 328, 344, 375/222; 348/726, 731, 735; 333/167
See application file for complete search history.

(56) References Cited

U.S. PATENT DOCUMENTS

| 3,278,866 | A | * | 10/1966 | Bose ......................... 333/17.1 |
| 4,499,495 | A | * | 2/1985 | Strammello ................. 348/731 |
| 5,155,453 | A | * | 10/1992 | Ruetz .................... 331/116 FE |
| 5,920,236 | A | | 7/1999 | Ishizaki |
| 6,124,766 | A | | 9/2000 | Matsuura |
| 6,131,023 | A | * | 10/2000 | Matsuura .................... 455/301 |
| 6,160,572 | A | | 12/2000 | Matsuura |
| 7,289,566 | B2 | * | 10/2007 | Matsuura .................... 375/257 |
| 2004/0166799 | A1 | * | 8/2004 | Kral .......................... 455/3.02 |

FOREIGN PATENT DOCUMENTS

| EP | 0911962 A1 | 4/1999 |
| EP | 0920121 A1 | 6/1999 |
| JP | A5183906 | 7/1993 |

(Continued)

OTHER PUBLICATIONS

Zverev, "Handbook of Filter Synthesis", published by John Wiley & Sons, Inc. 1967.*
Wikipedia Information about Colpitts Oscillator, 2001.*
English Translation to Japanese Patent, JP 11127211 A.*

*Primary Examiner*—Chris Kelley
*Assistant Examiner*—Usha Raman
(74) *Attorney, Agent, or Firm*—Birch, Stewart, Kolasch & Birch, LLP (57) ABSTRACT

An IF input signal corresponding to a selected reception channel is applied through an SAW filter to an IF-AGC circuit, the amplitude of the signal is adjusted to a prescribed level, and the signal is thereafter supplied to a down converter unit. The down converter unit selectively outputs a Low-IF signal provided by down-converting the IF input signal and the High-IF signal amplified without frequency conversion, in accordance with an external instruction. A filter circuit has its cut off frequency selectively set to pass the Low-IF signal only, or both the Low-IF and High-IF signals.

3 Claims, 10 Drawing Sheets

FOREIGN PATENT DOCUMENTS

| | | |
|---|---|---|
| JP | 6-133318 A | 5/1994 |
| JP | A6189220 | 7/1994 |
| JP | A779390 | 3/1995 |
| JP | A8331474 | 12/1996 |
| JP | 9-93152 A | 4/1997 |
| JP | 9-181631 A | 7/1997 |
| JP | 10-32805 A | 2/1998 |
| JP | 10-304261 A | 11/1998 |
| JP | 11-127211 A | 5/1999 |
| JP | 11-261980 A | 9/1999 |
| JP | 2000-151272 A | 5/2000 |
| JP | 2001-8179 A | 1/2001 |

* cited by examiner

CABLE MODEM TUNER

BACKGROUND OF THE INVENTION

1. Field of the Invention

The present invention relates to a cable modem tuner. More specifically, the present invention relates to a cable modem tuner suitable for outputting an intermediate frequency signal to a QAM demodulating circuit.

2. Description of the Background Art

In a cable television system (hereinafter referred to as CATV), introduction of HFC (Hybrid Fiber/Coax) has been in progress, in which a coaxial cable is kept as a subscriber's drop wire and the main network is implemented by optical fibers. This system attempts to provide broad-band data communication service of several Mbits/sec at home. Utilizing this system, it is possible to realize high speed data line having the transmission rate of 30 Mbits/sec with the bandwidth of 6 MHz using 64 QAM (Quadrature Amplitude Modulation), which may not be called the state of the art any more. The cable modem is used in this system, and realizes high speed data communication of 4 Mbits/sec to 27 Mbits/sec, utilizing an unused channel of CATV. The cable modem tuner is used for a cable modem in such a CATV system, and after the received CATV signal is subjected to frequency conversion, it serves to take out the signal as an intermediate frequency signal.

Figure 10:
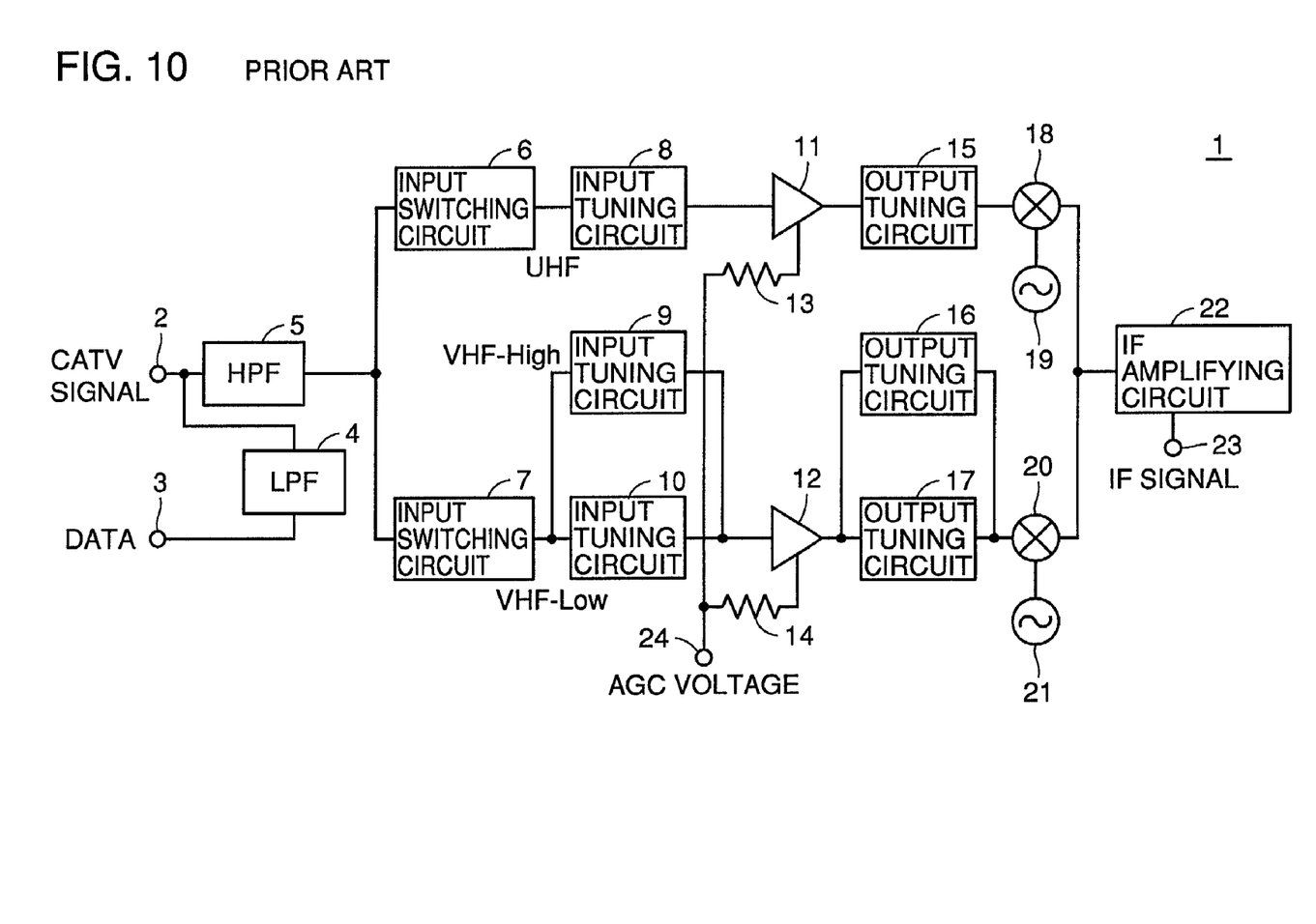
FIG. 10 is a schematic block diagram of a conventional cable modem tuner.

FIG. 10 is a block diagram representing a configuration of a conventional cable modem tuner 1.

As for the CATV signals, an up signal transmitted to a station has the frequency of 5 MHz to 42 MHz, and a down signal transmitted from the station to the cable modem tuner has the frequency of 54 MHz to 860 MHz, and transmitted to a cable network through an input terminal 2 of the tuner. The up signal transmitted from the cable modem is received by a data receiver of the CATV station (system operator), and enters a computer of a center.

Referring to FIG. 10, the cable modem tuner 1 includes a CATV signal input terminal 2 receiving the CATV signal as an input, a data terminal 3 receiving a data signal from a QPSK transmitter as an input, and an upstream circuit (LPF) 4 provided between data terminal 3 and CATV signal input terminal 2. In the cable modem, a data signal subjected to quadrature phase shift keying (QPSK) from a QPSK transmitter, for example, is input to data terminal 3 as the up signal. The data signal is transmitted through upstream circuit 4 to the CATV station.

The down signal input through input terminal 2 is divided into a UHF band (hereinafter also referred to as a B3 band) receiving the frequency of 470 to 860 MHz, a VHF-High band (hereinafter also referred to as B2 band) receiving the frequency of 170 to 470 MHz and a VHF-Low band (hereinafter also referred to as B1 band) receiving the frequency of 54 to 170 MHz, and processed by receiving circuits provided for respective bands. Band ranges are not limited to those specified above.

The cable modem tuner 1 further includes a high pass filter (HPF) 5 having an attenuation range of 5 to 46 MHz and a pass band of not lower than 54 MHz, and input switching circuits 6 and 7 for allocating the signals passed through the high pass filter 5 to circuits corresponding to respective bands.

The down signal is passed through high pass filter 5, the band is switched by the input switching circuits 6 and 7, and supplied to the circuitry corresponding to any of the aforementioned bands B1 to B3.

Cable modem tuner 1 further includes high frequency amplification input tuning circuits 8, 9 and 10 provided corresponding to respective bands B1 to B3; high frequency amplification AGC circuits 11 and 12 provided corresponding to the UHF band and VHF band, respectively; high frequency amplification output tuning circuits 15, 16 and 17 provided corresponding to respective bands B1 to B3; a mixer circuit 18 and a local oscillation circuit 19 provided corresponding to the UHF band; a mixer circuit 20 and a local oscillation circuit 21 provided corresponding to the VHF band; and an intermediate frequency amplifying circuit 22 for amplifying, in the intermediate frequency band, outputs from mixer circuits 18 and 20.

The high frequency amplification input tuning circuits, the high frequency amplification AGC circuits, the high frequency amplification output tuning circuits, the mixer circuits and the local oscillation circuits provided corresponding to respective bands are adapted such that dependent on the received channel, circuits corresponding to the received band are made operative, while the circuits corresponding to other bands are made inoperative. For example, when a UHF channel is received, the high frequency amplification input tuning circuit 8, the high frequency amplification AGC circuit 11, high frequency amplification output tuning circuit 15, mixer circuit 18 and local oscillation circuit 19 for the UHF band are set to the operative state, while high frequency amplification input tuning circuits 9 and 10, high frequency amplification AGC circuit 12, high frequency amplification output tuning circuits 16 and 17, mixer circuit 20 and local oscillation circuit 21 for the VHF-High and VHF-Low bands are set to inoperative state, and stop their operation.

The CATV signal input to the input terminal 2 is passed through high pass filter 5 as described above, and enters input switching circuits 6 and 7, where band switching takes place. The output therefrom is fed to high frequency amplification input tuning circuit 8, 9 or 10, where channel selection takes place. After channel selection, the signal is input to AGC terminal 24, amplified to a prescribed level by high frequency amplification circuit 11 or 12 based on the AGC voltage applied to resistance 13 or 14, supplied to high frequency output tuning circuit 15, 16 or 17, where the received signal is extracted.

Thereafter, the selected received signal is subjected to frequency conversion by mixer circuit 18, 20 and local oscillation circuit 19, 21 to an intermediate frequency (hereinafter also referred to as IF), and amplified by intermediate frequency amplification circuit 22.

The intermediate frequency signal hereinafter referred to as an IF signal) amplified by intermediate frequency amplifying circuit 22 is output from output terminal 23.

In this manner, in the conventional cable modem tuner 1, a received CATV signal is selected in accordance with the reception channel, and the signal after channel selection is subjected to frequency conversion and output as an IF signal from output terminal 23.

Handling of a QAM signal, which is a digital signal, and transmitting the IF signal output from output terminal 23 to a QAM demodulating circuit, not shown, for QAM demodulation by using such a cable modem tuner 1 has the following various problems.

(1) First, dependent on the type of QAM demodulating IC used as the QAM demodulating circuit, IF signal of a different frequency band becomes necessary. In the following description, of the IF signals, those output from the conventional cable modem tuner are described as having the frequency band of High-IF, and the frequency range generally not higher than 10 MHz and lower than the High-IF will be referred to as Low-IF. At present, QAM demodulating ICs include ICs for receiving Low-IF QAM signals and ICs for receiving High-IF QAM signals. These result from the limitation imposed by the performance of analog/digital converter used in the QAM demodulating ICs. Accordingly, in order to attain a frequency range that can be received by the QAM demodulating IC connected in the succeeding stage, two different types of cable modem tuners have been necessary, or a frequency converting circuit positioned between the cable modem tuner and the QAM demodulating IC has been necessary.

(2) It is specified in DOCSIS (cable modem specification in North America) that the maximum output level of the transmitted upstream signal must be constant and +58 dBmV, and a signal level satisfying this specification is necessary at the input end of the tuner. The input level of the conventional cable modem tuner has been not up to this level.

(3) According to DOCSIS, it is required that the upstream transmission signal can be variably controlled 1 dB by 1 dB, from +58 to +6 dBV. Conventionally, such a function was not required.

(4) According to DOCSIS specification, the high frequency level of the transmission signal must be at least −50 dBmV, and in the example shown in FIG. 10, it is necessary to improve significantly from the conventional level.

(5) A further problem is that measures against digital noise are necessary. As the QAM demodulating IC requires high input signal level, an amplifier having a high gain is necessary. Therefore, when the overall system is configured, the clock noise and the bus noise of a CPU (Central Processing Unit) also come to have high levels. As it is a common practice to mount the QAM demodulating IC, the CPU and the cable modem tuner on one board, influence of such noises would be significant.

Though a cable modem tuner is shown in FIG. 10 described above, a CATV tuner referred to as a digital set top box (hereinafter referred to as STB) has come to be used. In the cable modem, the down data signal transmitted from the CATV station is displayed on a television monitor, while in the STB, a QPSK modulated down data signal transmitted from the CATV station is branched from the tuner portion, and processed by CPU to be output to a personal computer.

Accordingly, in the cable modem, an unused channel of the CATV in 54 MHz to 860 MHz band is used for transmitting the down data signal as described above, whereas in the STB, the frequency band of 70 MHz to 130 MHz is used.

In the STB, there is a branching circuit provided for branching the down data signal on the output side of the HPF shown in FIG. 10, and the branched down data signal is output to an OOB (Out Of Band) terminal. The OOB terminal provides the branched data to CPU.

In the STB also, as for the CATV signals, the up signal has the frequency of 5 MHz to 42 MHz and the down signal has the frequency of 54 MHz to 860 MHz, and connected to the cable network through input terminal 2. The up signal transmitted from the STB is received by the data receiver at the CATV station, and input to a computer of the center.

In the STB, the data signal subjected to QPSK from QPSK transmitter (not shown) is introduced to the data terminal as the up signal. The data signal is fed to the STB by the computer at the center through the CATV circuit, processed by the CPU (not shown) in the STB, and applied to the QPSK modulator. Except for these points, the operation is similar to that in the cable modem tuner shown in FIG. 10, and hence, the STB also has the same problems as the cable modem tuner described above.

SUMMARY OF THE INVENTION

Therefore, an object of the present invention is to provide a cable modem tuner capable of outputting a signal suitable for QAM demodulation.

Briefly stated, the present invention provides a cable modem tuner, including a tuner circuit taking a signal corresponding to a reception channel from input signals, amplifying and converting to an intermediate frequency signal of a first frequency band, and a down converter circuit receiving the intermediate frequency signal of the first frequency band and selectively outputting an intermediate frequency signal of the first frequency band or a second frequency band lower than the first frequency band. The down converter circuit generates, in a first mode in which the intermediate frequency of the second frequency band is output, an oscillation signal corresponding to the second frequency band, and stops generation of the oscillation signal in the second mode in which the intermediate frequency signal of the first frequency band is output. The intermediate frequency signal of the first frequency band input to the down converter circuit and an output from the local oscillation circuit are mixed by a mixer circuit, and a filter circuit, receiving the output signal from the mixer circuit, passes a signal of a frequency band that corresponds to a set cut off frequency.

Thus, it becomes possible to selectively output intermediate frequency signals of different frequency bands, by a circuit of one configuration. As a result, it becomes possible to generally use the cable modem tuner for QAM demodulating circuits having different input frequency ranges. Further, as the filter circuit is connected as an output load of the mixer circuit, it is possible to suppress leakage from the local oscillation circuit.

In a preferred embodiment, in the tuner circuit, a signal amplitude corresponding to the reception channel is adjusted to a prescribed level by a first automatic gain amplifier, a second automatic gain amplifier is positioned between the tuner circuit and the down converter circuit so as to adjust the amplitude of the intermediate frequency signal of the first frequency band to a prescribed level, and the total gain therefrom is set to at least 55 dB.

In this manner, in addition to the automatic gain control circuit for the high frequency band included in the tuner circuit, an automatic gain control circuit for the intermediate frequency signal is provided, and therefore, fluctuation of the output signal is suppressed even when there is fluctuation in the input reception signal level. As a result, a satisfactory signal can be provided as an input signal to the QAM demodulating circuit.

Further, as the total gain of at least 55 dB is secured at the AGC portion, the input signal level of 1Vp-p required for the QAM demodulating circuit can be attained.

More preferably, the tuner circuit and the down converter circuit output non-parallel type signals, and a signal converting circuit receiving an output of the down converter circuit converts the signals to parallel type signals.

As the non-parallel signal is converted to a parallel signal, a signal suitable as an input signal to the QAM demodulating circuit can be provided.

More preferably, the mixer circuit amplifies an intermediate frequency signal of the first frequency band in the second mode.

More preferably, the local oscillation circuit has an oscillation element oscillating at the second frequency band, a first bipolar transistor receiving at an input electrode, an output of the oscillating element, a first bias resistance coupled between the input electrode of the first transistor and a first voltage node, and a second bias resistance coupled between an output electrode of the first bipolar transistor and the ground node. The mixer circuit has a second bipolar transistor connected to the first voltage node and receiving at an input electrode, an output of the oscillating element and the intermediate frequency signal of the first frequency band, and a third bias resistance coupled between an input electrode of the second bipolar transistor and a second voltage node supplying a voltage higher than the first voltage node.

More preferably, the local oscillation circuit further has a switch element connected parallel to the oscillating element, of which on/off is instructed externally, and the switch element is turned off/on in the first and second modes, respectively.

More preferably, the filter circuit and the second bias resistance are mounted on one surface of a printed board, while the down converter portion except for the second bias resistance is mounted on the other surface of the printed board.

More preferably, the cut off frequency is set to pass the signal of the second frequency band and attenuate the signal of the first frequency band in the first mode, and to pass the signals of the first and second frequency bands in the second mode.

More preferably, the filter circuit has an induction element, a first capacitance element coupled between the induction element and the ground node, a second capacitance element coupled in parallel with the induction element, and a switch element provided parallel to the second capacitance element, and having its on/off instructed externally, wherein the switch element turns off and on in the first and second modes, respectively.

Further, an intermediate frequency AGC unit positioned between the tuner unit and the down converter unit, for adjusting amplitude of the intermediate frequency signal of the first frequency band to a prescribed range, and a signal converting circuit receiving an output from the down converter unit and converting to a parallel signal are provided. The cut off frequency is set to pass the signal of the second frequency band and attenuate the signal of the first frequency band in the first mode, and to pass the signals of the first and second frequency bands in the second mode.

Further, when the tuner unit, the intermediate frequency AGC unit, the down converter unit and the signal converting circuit are contained in one same box, it is possible to reduce the influence of external noise.

More preferably, an upstream circuit for transmitting a data signal to a cable television station, and a high pass filter for receiving multiwave down signals from the cable television station while removing the data signal are provided.

The upstream circuit includes a variable gain amplifying circuit for amplifying the data signal to the CATV station with a prescribed gain, and a coupling circuit for coupling an output of the amplifying circuit to an input of the high pass filter.

Further, a down data signal of a different bandwidth from the multiwave down signal from the CATV station is input through the cable to the receiving circuit, and the receiving circuit includes a branching circuit branching and outputting the down data signal.

Further, the upstream circuit, the tuner, the high pass filter and the down converter are contained in a sealed case partitioned individually.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

In the following, embodiments of the present invention will be described in detail with reference to the figures.

Figure 1:
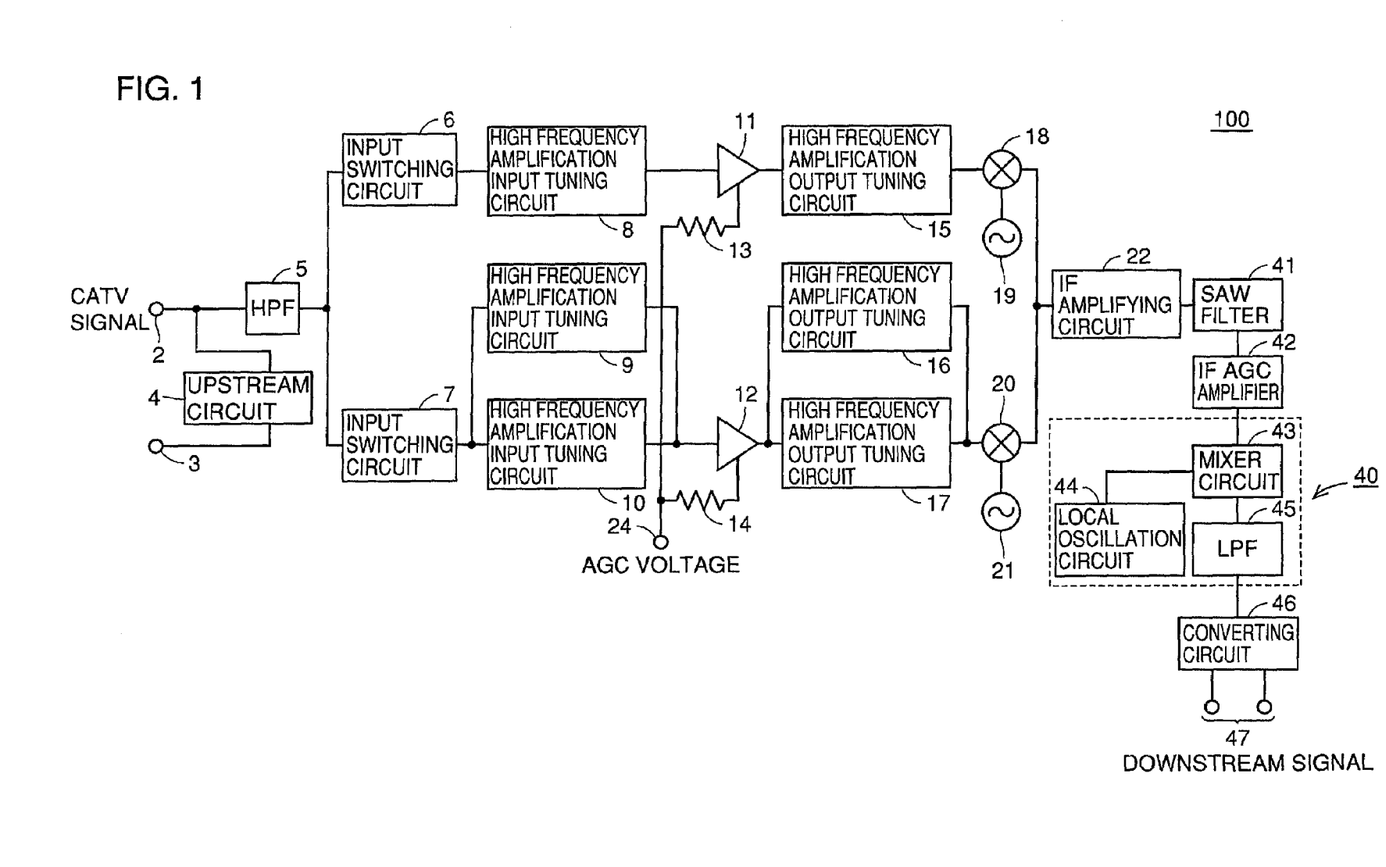
FIG. 1 is a block diagram representing a configuration of the cable modem tuner in accordance with an embodiment of the present invention.

FIG. 1 is a block diagram representing a configuration of the cable modem tuner 100 in accordance with an embodiment of the present invention.

Referring to FIG. 1, the cable modem tuner 100 in accordance with the present invention differs from the conventional cable modem tuner 1 shown in FIG. 10 in that it has an SAW filter 41 receiving an IF input signal of High-IF output from intermediate frequency amplifying circuit 22 and converting the received signal to an IF output signals suitable for QAM demodulation that is set to either the High-IF or Low-IF frequency band selectively, an intermediate frequency AGC circuit (hereinafter referred to as IF-AGC circuit) 42, a down converter 40 and a parallel/non-parallel converting circuit 46. The IF output signal is applied from output terminal 47 to QAM demodulating circuit.

Thereafter, blocks up to generation of the IF input signal, that is, components contained in the conventional cable modem tuner 1 are the same as those described above, and therefore, description thereof is not repeated.

Down converter 40 of cable modem tuner 100 includes a local oscillation circuit 44 for generating an oscillation signal of the frequency band corresponding to Low-IF, a mixer circuit 43 for mixing an output signal of IF-AGC circuit 42 with the oscillation signal, and a filter circuit 45 that is capable of switching cut off frequency when the Low-IF signal is output and when the High-IF signal is output.

The IF input signal corresponding to the reception channel selected by the tuner is passed through the SAW filter 41, has its amplitude adjusted to a prescribed level by IF-AGC circuit 42, and thereafter fed to the mixer circuit 43.

As will be described in detail later, down converter unit 40 is capable of selectively outputting either the High-IF signal or the Low-IF signal, in accordance with an external switching instruction.

When output of Low-IF signal is instructed externally (hereinafter also referred to as Low-IF signal output mode), an oscillation signal corresponding to the Low-IF signal is output by the local oscillation circuit 44. Mixer circuit 43 mixes an output from IF-AGC circuit 42 with the oscillation signal, and provides the Low-IF signal. Filter circuit 45 sets the cut off frequency such that the signal of the Low-IF band is passed, in response to the external switch instruction, and outputs the Low-IF signal to parallel/non-parallel converting circuit 46.

When the output of the High-IF signal is instructed externally (hereinafter also referred to as High-IF signal output mode), it is unnecessary for the down converting unit 40 to perform frequency conversion, and what is necessary is simply to output the signal having the same frequency as the IF input signal. Therefore, in this case, oscillation of the local oscillation circuit 44 is stopped, and mixer circuit 43 operates as an intermediate frequency amplifying circuit. Here, filter circuit 45 sets the cut off frequency such that the signal of the High-IF band is passed, in response to the external instruction. As a result, the High-IF signal is output from down converter unit 40. This signal is a non-parallel signal, and hence it is converted to a parallel signal by the parallel/non-parallel converting circuit 46.

Figure 2:
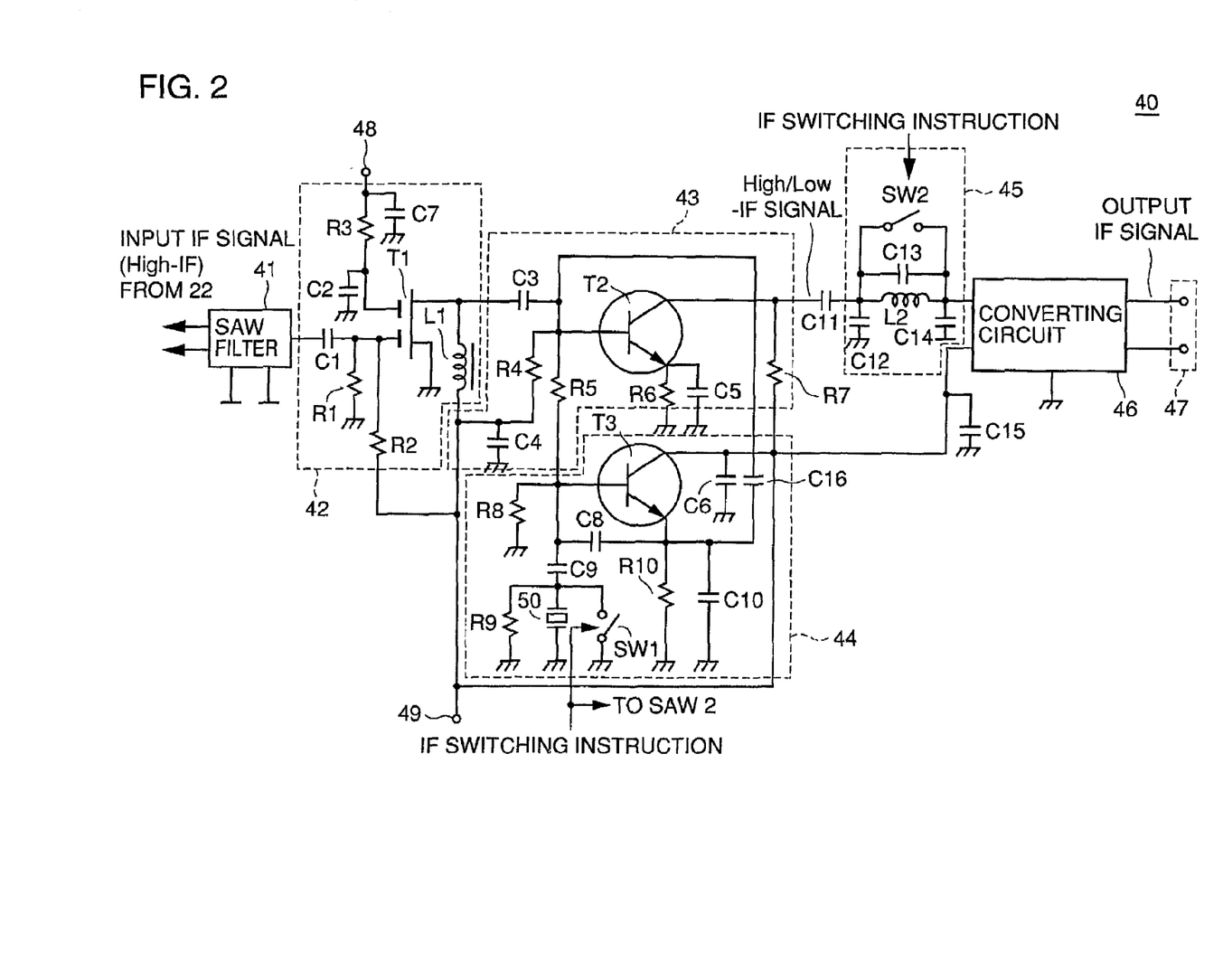
FIG. 2 is a circuit diagram representing a specific configuration of the down converter unit included in the cable modem tuner shown in FIG. 1.

FIG. 2 is a circuit diagram representing a specific configuration of the down converter unit 40.

Referring to FIG. 2, SAW filter 41 has a function of converting the IF input signal received from intermediate frequency amplifying circuit 22 to a bandwidth to be transmitted, and of removing unnecessary signals. The SAW filter 41 is for extracting voltage oscillation caused by surface acoustic wave, by an electrode provided on a surface of a piezoelectric element, and characterized in that resonance characteristic is variable dependent on the position and structure of the electrode.

IF-AGC circuit 42 includes a dual gate type field effect transistor T1, receiving an output signal from SAW filter 41 and an AGC voltage input to AGC terminal 48. Transistor T1 is provided for amplifying the output signal from SAW filter 41 in accordance with the AGC voltage. Between the AGC terminal 48 and one of the dual gates, resistance element R3 is connected, and between the ground and the AGC terminal 48 and between the ground and one of the dual gates, ground capacitors C7 and C2 are connected, respectively.

Between the SAW filter 41 and the other one of the dual gates, a capacitor C1 for preventing DC component to transistor T1 is connected, a resistance element R1 is connected between the other end of the dual gate and the ground, and a gate bias resistance R2 is connected between the other one of the dual gates and the power supply terminal 49. An inductor L1 corresponds to a choke coil.

The AGC voltage is set by the AGC control circuit (not shown) to secure the level 1Vp-p of the output IF signal applied from the output terminal 47 to the QAM demodulating circuit. The gain attenuation amount of IF-AGC by the IF-AGC circuit 42 having such a structure is about 50 dB. Therefore, by the combination with the RF-AGC implemented by high frequency amplification AGC circuits 11 and 12, it is possible to ensure a level of 1Vp-p of the output IF signal.

Mixer circuit 43 and local oscillation circuit 44 include bipolar transistors T2 and T3, respectively. Between the bases of bipolar transistors T2 and T3, a resistance element R5 as a base bias is connected, between the base (first voltage node) of bipolar transistor T2 and power supply terminal (second voltage node) 49, a resistance element R4 is connected, and between the base of bipolar transistor T3 and the ground, a resistance element R8 is connected.

By setting the collector-emitter voltage $V_{CE}$ of bipolar transistor T2 in mixer circuit 43 to 2.5V, and by setting $V_{CE}$ of bipolar transistor T3 in local oscillation circuit 44 to about 1.5V, it is possible to reduce power consumption.

Local oscillation circuit 44 further includes a quartz oscillator 50. Both the over tone type and fundamental wave type oscillators can be applied as the quartz oscillator 50. A capacitor C16 provided between the emitter of bipolar transistor T and the base of bipolar transistor T2 is a capacitance element for supplying the oscillation signal to the mixer. When bipolar transistors T2 and T3 are realized as twin type elements, it is possible to implement capacitor C16 by the parasitic resistance in the mold. This further reduces the number of components.

Local oscillation circuit 43 further has a switch SW1 provided parallel to the quartz oscillator 50. By turning on the switch SW1 in response to an external switch instruction, the output node of quartz oscillator 50 can be forced to be connected to the ground node, attaining the same effect as stopping oscillation.

Capacitors C4, C5 and C6 positioned in mixer circuit 43 and local oscillation circuit 44 are ground capacitances, while capacitors C8 and C10 are feedback capacitances. Capacitors C3, C9 and C11 are provided for preventing the DC component of the signal. Resistance element R6 is connected between the emitter of bipolar transistor T2 and the ground, resistance element R2 is connected between the collectors of bipolar transistors T2 and T3, and resistance element R10 is connected between the emitter of bipolar transistor T3 and the ground. The resistance elements R6, R7 and R10 are bias resistances provided corresponding to bipolar transistors T2 and T3, and resistance element R9 is a dumping resistance for adjusting oscillation frequency of quartz oscillator 50.

Filter circuit 45 is formed, as an example, by a low pass filter in FIG. 2, and has an inductor L2 passing an output from mixer circuit 43, a capacitor C13 connected parallel to inductor L2, a switch SW2 connected parallel to the inductor L2 and capacitor C13, and capacitors C12 and C14 connected between the inductor L2 and the ground node.

Cut off frequency of the filter circuit 45 can be switched by turning on/off the switch SW2 in accordance with an external switch instruction. More specifically, in the High-IF signal output mode and the Low-IF signal output mode, SW2 is turned on and off, respectively.

When switch SW2 is off, filter circuit 45 passes the Low-IF signal and attenuates the High-IF signal. Therefore, the values of capacitors C12, C13 and C14 and of inductor L2 are determined such that the cut off frequency is lower than the High-IF band and higher than the Low-IF band.

When the switch SW is on, both ends of inductor L2 and capacitor C13 are short-circuited. Therefore, the cut off frequency goes high, and filter circuit 45 passes the High-IF signal as well. At this time, the value of capacitor C14 is set such that the cut off frequency at this time becomes higher than the High-IF band.

In this manner, by providing a filter circuit 45 of which cut off frequency can be switched in accordance with an external instruction, it becomes possible to operate the filter circuit as an intermediate frequency tuning circuit.

Further, as filter circuit 45 is connected as a load to mixer circuit 43, the effect of minimizing leakage of the local oscillation circuit 44 is also attained.

The output of filter circuit 45 is transmitted to parallel/non-parallel converting circuit 46. Parallel/non-parallel converting circuit 46 converts the output of filter circuit 45 to 2-output signals different in phase by 90°, and provides as parallel outputs, to output terminal 47. As the output of cable modem tuner 100 is turned to the parallel signals by parallel-non-parallel converting circuit 46, it becomes possible to directly connect the cable modem tuner 100 to the QAM demodulating IC provided in the succeeding stage.

If a configuration that has the same function and is capable of passing the signals of the frequency ranges in the High-IF signal output mode and the Low-IF signal output mode, any structure may be used for filter circuit 45, other than the example shown in FIG. 2. The same applies to the configurations of IF-AGC circuit 42, mixer circuit 43 and local oscillation circuit 44.

Switches SW1 and SW2 provided for local oscillation circuit 44 and filter circuit 45 are turned on in the High-IF signal output mode, and turned off in the Low-IF signal output mode. Switches SW1 and SW2 are commonly controlled in accordance with an external instruction. Electronic switches and mechanical switches may be used as switches SW1 and SW2.

When switches SW1 and SW2 are turned on, oscillation of quartz oscillator 50 is stopped, and the cut off frequency of filter circuit 45 becomes higher. Therefore, mixer circuit 43 amplifies the IF input signal without changing the frequency thereof, and filter circuit 45 passes the High-IF signal.

When switches SW1 and SW2 are off, the oscillation output of the Low-IF band of quartz oscillator 50 is amplified by local oscillation circuit 44 and transmitted to mixer circuit 43. Mixer circuit 43 mixes the oscillation signal received from local oscillation circuit 44 with the output signal of IF-AGC circuit 42, and provides a signal in the Low-IF signal band. The capacitance value of capacitor C13 in filter circuit 45 is set such that the signal in the Low-IF signal band is passed while the signal in the High-IF signal band is attenuated, when switch SW2 is off.

Because of this structure, down converter unit 40 including mixer circuit 43, local oscillation circuit 44 and filter circuit 45 outputs the signal in the High-IF band when switches SW1 and SW2 are on, and outputs a signal in the Low-IF band when switches SW1 and SW2 are off. More specifically, it becomes possible by a single down converter unit 30 to selectively output IF signals of different frequency bands, by turning on/off the switches. Thus, it can be commonly used for QAM demodulating ICs having inputs of different frequency bands.

Here, when the circuitry including mixer circuit 43 and local oscillation circuit 44 except for the bias resistance R10 are arranged on one surface of a printed board, and filter circuit 45 and bias resistance R10 are arranged on the other surface of the printed board, a circuit configuration is attained in which output of the High-IF signal can be realized simply by the circuits mounted on the other surface of the printed board, and by adding the circuit configuration on one surface of the printed board, the circuit configuration is realized in which both Low-IF and High-IF signals can selectively be generated.

As the switching function by switches SW1 and SW2 is provided, it is possible to mount the circuitry shown in FIG. 2 on one surface of the printed board.

Figure 3:
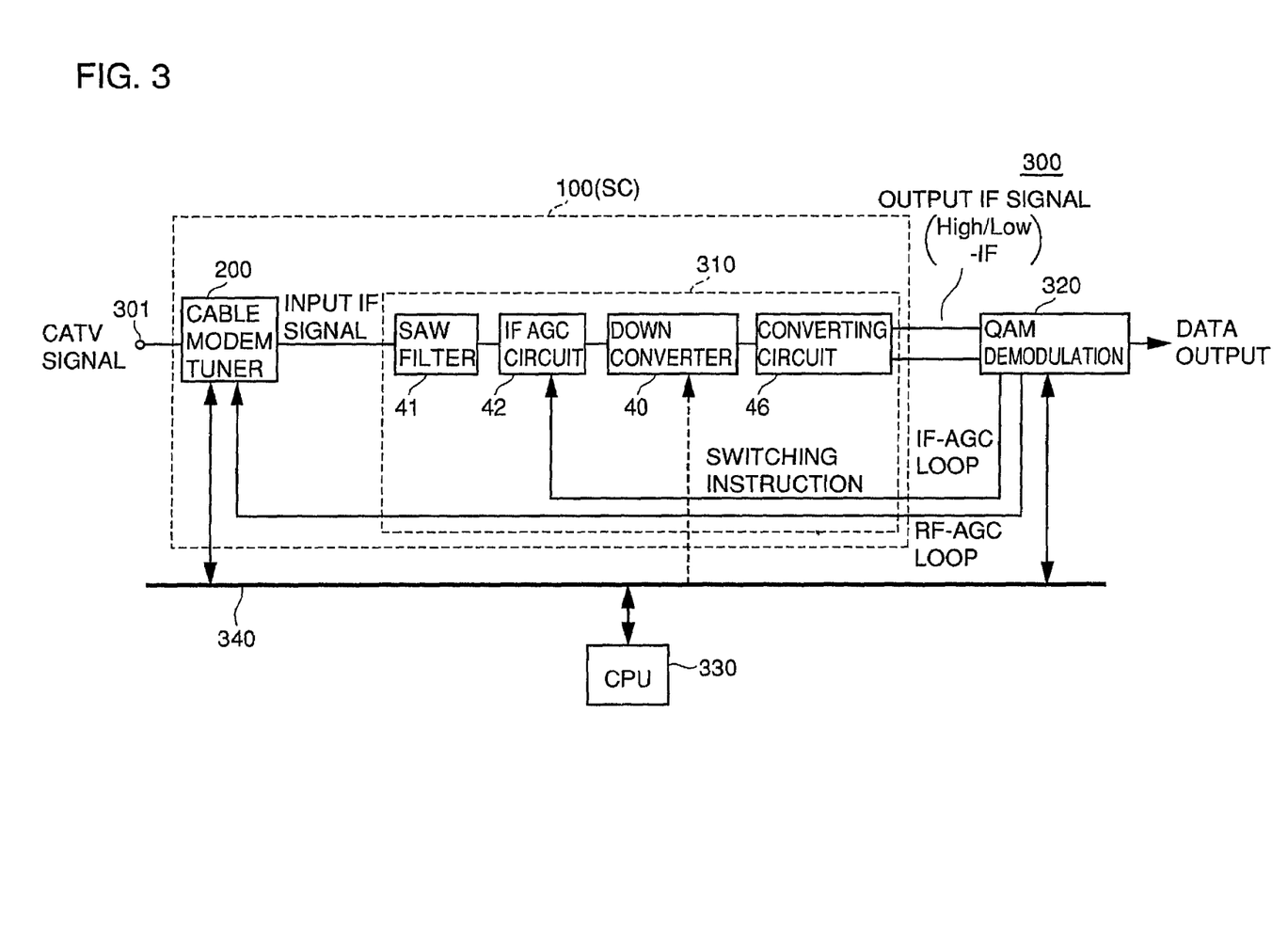
FIG. 3 is a block diagram representing an overall QAM demodulating system.

FIG. 3 is a block diagram showing the overall QAM demodulating system 300 in accordance with one embodiment of the present invention.

Referring to FIG. 3, QAM demodulating system 300 includes an input terminal 301 receiving the CATV signal, circuits 310 including the conventional cable modem tuner 200 and the circuits provided in the succeeding stage thereof, and a QAM demodulating IC 320. The conventional cable modem tuner 200 and the circuits 310 constitute the cable modem tuner 100 of the embodiment shown in FIG. 1, and provides the IF signal corresponding to the reception channel, to QAM demodulating IC 320. As already described, the IF signal output from cable modem tuner 100 can be set to either of the High-Low IF frequency bands, and the signal is a parallel type signal having the signal level of 1Vp-p. Namely, the signal is suitable as an input signal to the QAM demodulating IC 320.

As the output of cable modem tuner 100 and the input to QAM demodulating IC 320 are both parallel type, an additional effect of suppressing external digital noise at the connecting portion therebetween is also attained.

As the AGC voltage set in accordance with the input signal level to QAM demodulating IC 320 is supplied to the IF-AGC circuit 42 and the high frequency AGC circuit in tuner 200, an RF-AGC and IF-AGC loop is formed.

QAM demodulating system 300 further includes a processing unit (CPU) 330 for controlling the overall system, and a system bus 340 for transmitting signals within the system. CPU 330 controls, through system bus 340, the operation of selection by cable modem tuner 100, demodulating process by QAM demodulating IC 320 and the like. When switches SW1 and SW2 contained in the down converter unit are electronic switches, switch instruction of these switches is also given by the CPU 330.

In QAM demodulating system 300, the cable modem tuner 100 consisting of the conventional cable modem tuner 200 and the circuits 310 is contained in one box SC and shielded from the outside. Therefore, influence of external noise caused by the system bus CPU clock and the like on the cable modem tuner 100 can be suppressed.

As described above, the cable modem tuner in accordance with the present embodiment has a down converter unit that mixes an output of a local oscillation circuit capable of executing/stopping generation of an oscillation signal in a frequency band lower than the frequency band of the intermediate frequency signal output from the tuner unit, with the intermediate frequency signal of the frequency band output from the tuner unit. Therefore, by the circuit of one configuration, intermediate frequency signals of different frequency bands can be output selectively. As a result, the cable modem tuner can generally be used for QAM modulating circuits of different input frequency ranges. Further, as a filter circuit is connected as an output load of the mixer circuit, leakage at the local oscillation circuit can be suppressed.

Figure 4:
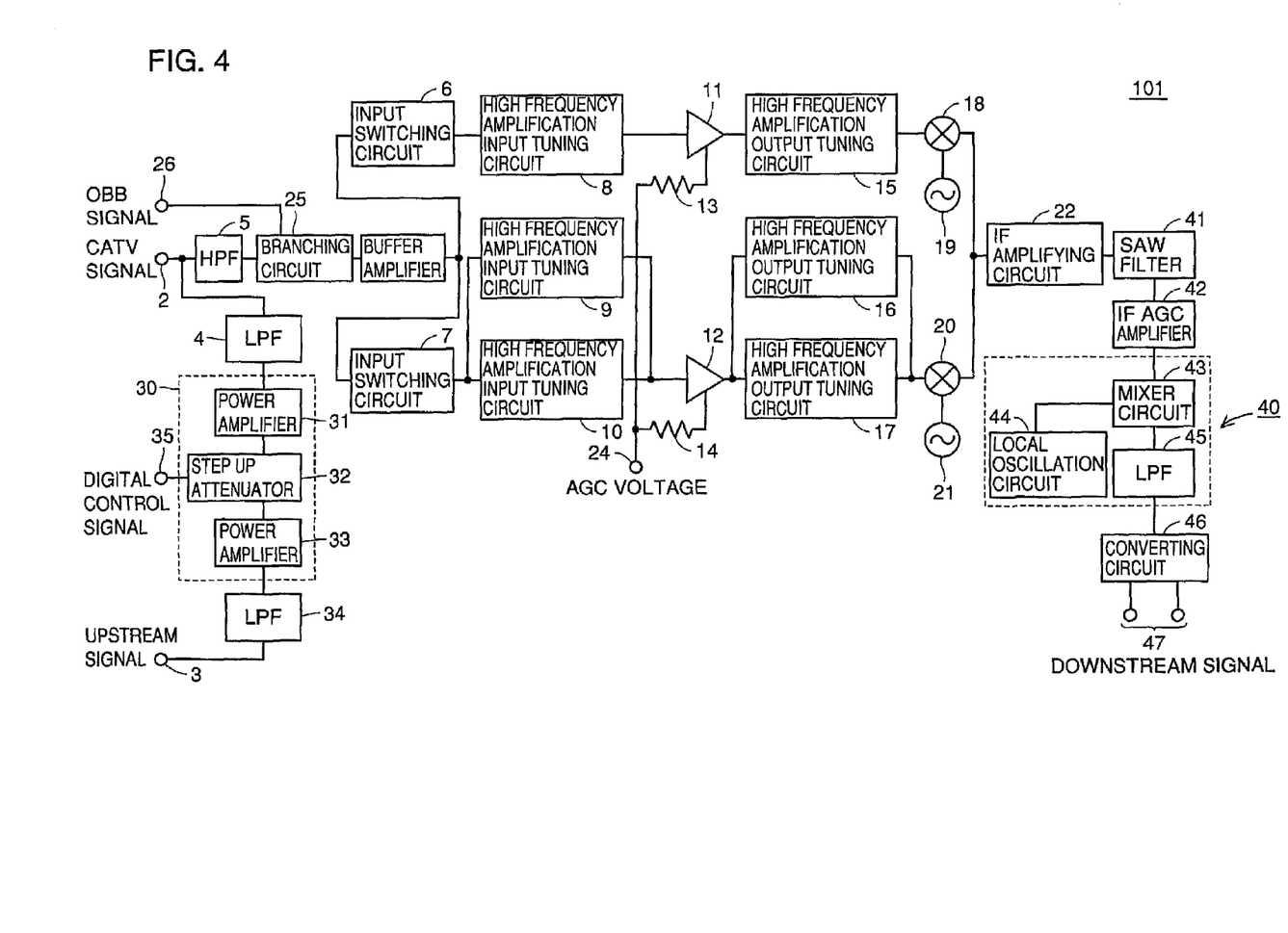
FIG. 4 is a block diagram representing a configuration of the STB in accordance with another embodiment of the present invention.

FIG. 4 is a block diagram showing a configuration of an STB 101 in accordance with another embodiment of the present invention. Referring to FIG. 4, as compared with the cable modem tuner 1 shown in FIG. 1, in the STB 101 of the present invention, a branching circuit 25 connected to an OBB terminal 26, and a buffer amplifier 27 are connected to the output side of HPF, and in addition, the following points are different. More specifically, a QPSK modulated return pass signal is input to a data input terminal 3, and further input to PGA (Programmable Gain Control) 30 through LPF 34. Further, a QPSK signal is applied to and amplified by a power amplifier 33 included in PGA 30, and gain-controlled by a step attenuator 32 that is variable 1 dB by 1 dB.

The control function is realized by I²C bus, 3 Wire bus or BCD cord, as a digital control signal input from gain control terminal 35, or an analog controlled AGC voltage, for example. The QPSK signal is further amplified by a power amplifier 31, and in total, that is, from the data input terminal 3 to input terminal 2, the gain is amplified to 26 dB or higher. To this end, the gain at the PGA 30 must be 26 dB to 30 dB, in consideration of spurious emission by linearity. The output from PGA 30 is provided from input terminal 2 through LPF4.

Figure 5:
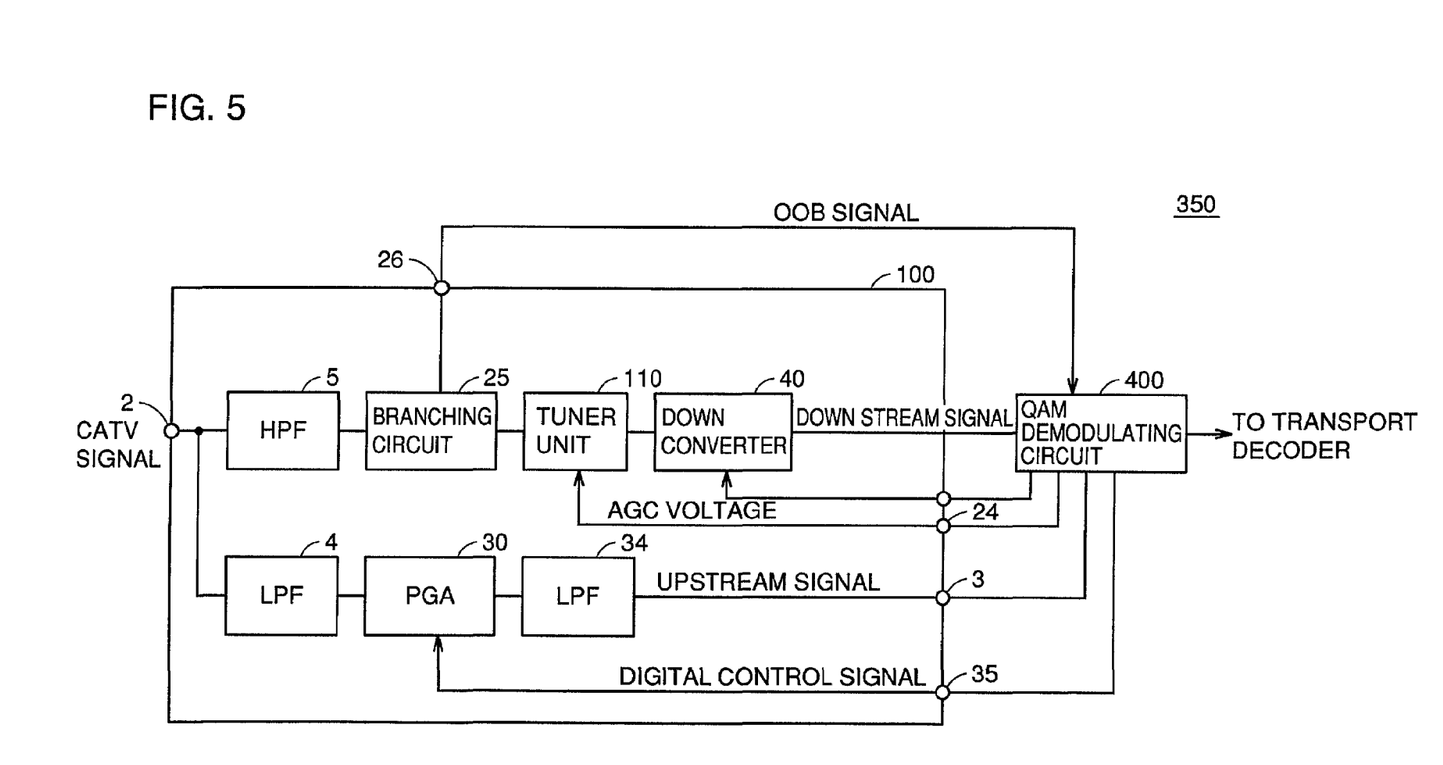
FIG. 5 is a block diagram representing an overall QAM demodulating system in accordance with another embodiment of the present invention.

FIG. 5 is a block diagram showing an overall QAM demodulating system 350 in accordance with another embodiment of the present invention. Referring to FIG. 5, QAM demodulating system 30 includes STB 101 shown in FIG. 4 and QAM demodulating circuit 400. FIG. 4 shows the main components of STB101, that is, HPF5, branching circuit 25, tuner unit 110, down converter circuit 40, LPF4, PGA30 and LPF34. Tuner unit 110 includes the components from buffer amplifier 27 to mixers 18 and 19 of FIG. 4.

As already described, the IF signal output from STB101 can be set to either of the High/Low-IF frequencies, the signal is parallel type, and has the signal level of 1Vp-p. Namely, the signal is suitable as an input signal to QAM demodulating circuit 400. Further, as the output of STB101 and the input of QAM demodulating circuit 400 are both made parallel type, the effect of suppressing external digital noise at the connecting portion therebetween can also be attained.

The up signal of QPSK is provided from QMA demodulating circuit 400 as a modulation signal (upstream signal), and supplied through LPF34 to PGA30. PGA30 has its gain controlled by the control signal from QAM demodulating circuit 400. The signal from PGA30 is fed to input terminal 2 through LPF4. Another downstream signal is branched through HPF5 from a video signal, as OBB signal, by branching circuit 25. The OBB signal is supplied to QAM demodulating circuit 400.

The video signal is selected by tuner unit 110, and input as an IF signal from down converter circuit 40 to QAM demodulating circuit 400. The QAM demodulated signal is applied as the data signal, to a transport decoder (not shown).

Figure 6:
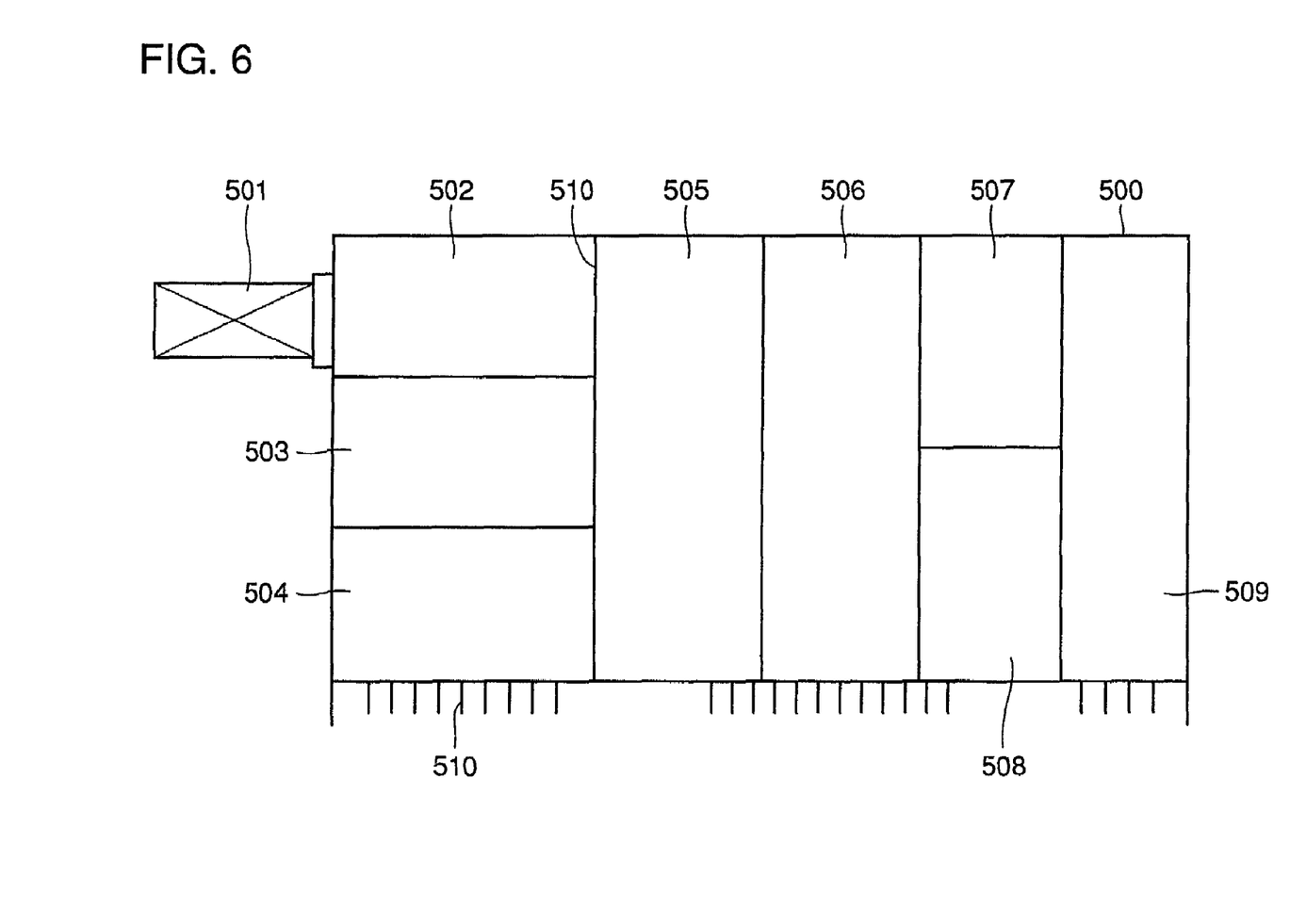
FIG. 6 shows a shield case in which each of the circuits constituting the cable modem tuner is contained, in accordance with an embodiment of the present invention.

FIG. 6 shows components constituting STB 101 in accordance with another embodiment of the present invention arranged in a shield case. Referring to FIG. 6, an F type connector 501 is mounted on an outer side of a shield case 500, and the inside of shield case 500 is divided into sections 502 to 509 by partition plates 510. In section 502, HPF5, branching circuit 25 and buffer amplifier 27 shown in FIG. 1 are contained. In section 503, PGA30 is contained, and in section 504, LPFs 4 and 34 are contained. In section 505, input switching circuits 6 and 7, and high frequency amplification input tuning circuits 8, 9 and 10 are contained, in section 506, high frequency amplification AGC circuit 11 and 12 are contained, in section 307, local oscillators 19 and 21 are contained, and in section 508, mixers 18 and 20 are contained. Further, on a side surface of shield case 500, terminals 510 including a power supply terminal, a data terminal and the like are provided.

By the shield case structured as described above, spurious emission appearing at input end can be reduced, and flowing of high frequency signal to the downstream side can be minimized.

Figure 7:
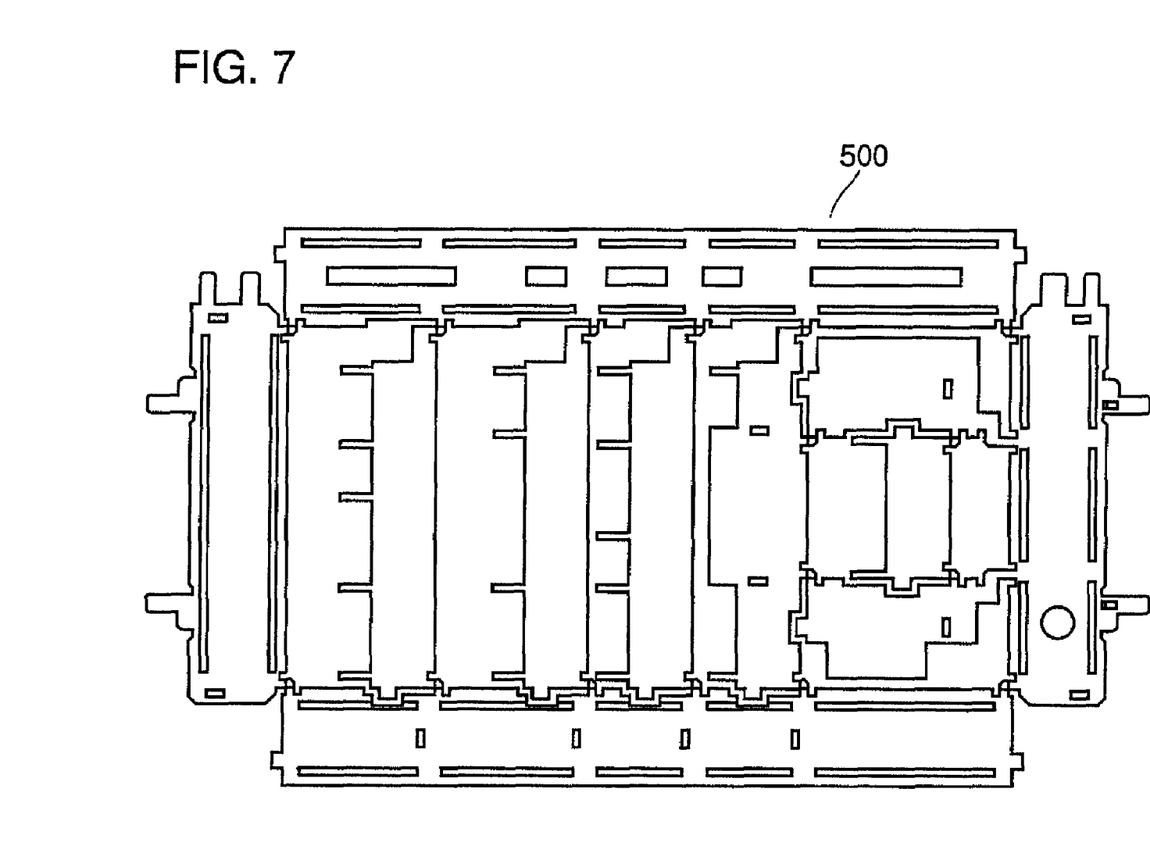
FIG. 7 is a layout of the shield case shown in FIG. 4.
Figure 8A:
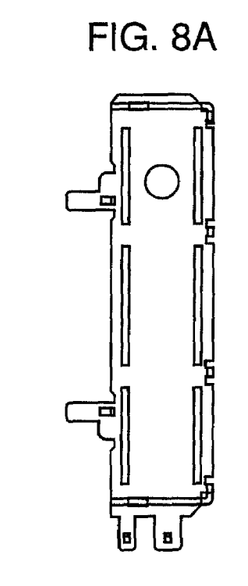
FIGS. 8A to 8C represent the shield case after assembly.
Figure 8B:
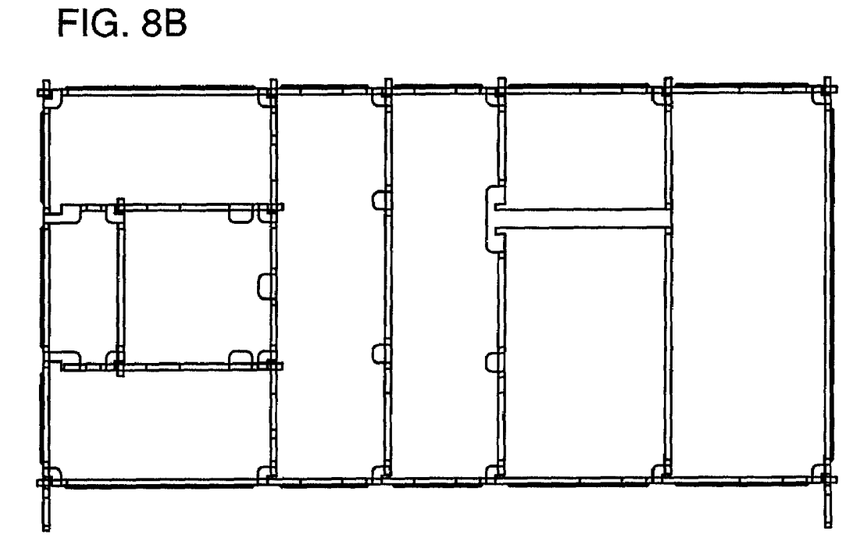
Figure 8C:
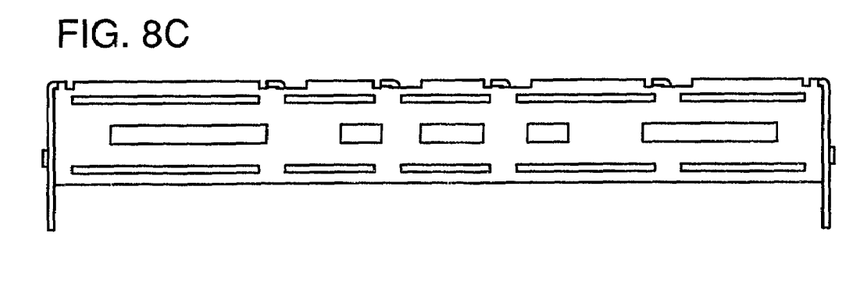

FIG. 7 is a plan of shield case 500, and FIGS. 8A to 8C show three sides of the shield case.

As can be seen from FIG. 7, it is possible to form shield case 500 from one metal plate, by press machining, together with the side plates and the partition plates. After pressing, by bending the side plates and attaching the partition plates as shown in FIGS. 8A to 8C, the case can be manufactured at a relatively low cost.

Figure 9A:
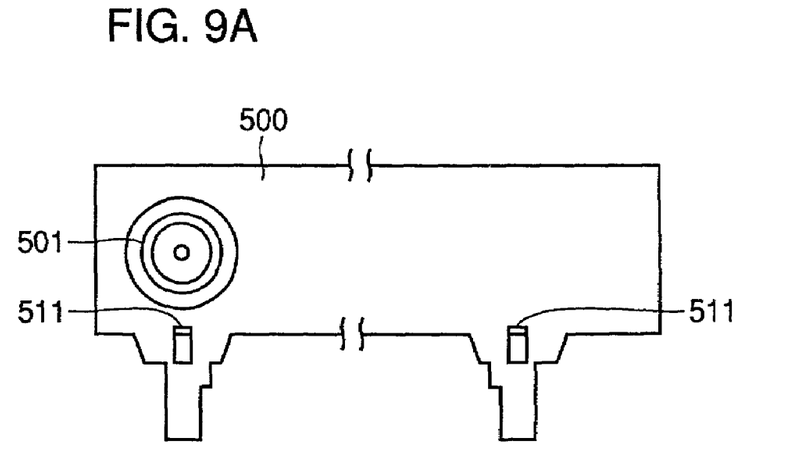
FIGS. 9A to 9C illustrate the state of fitting between the shield case and a shield lid.
Figure 9B:
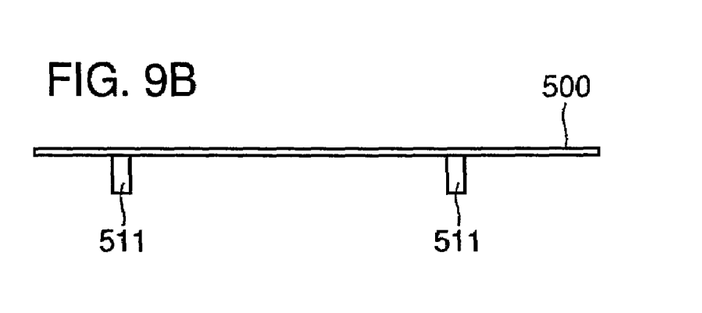
Figure 9C:
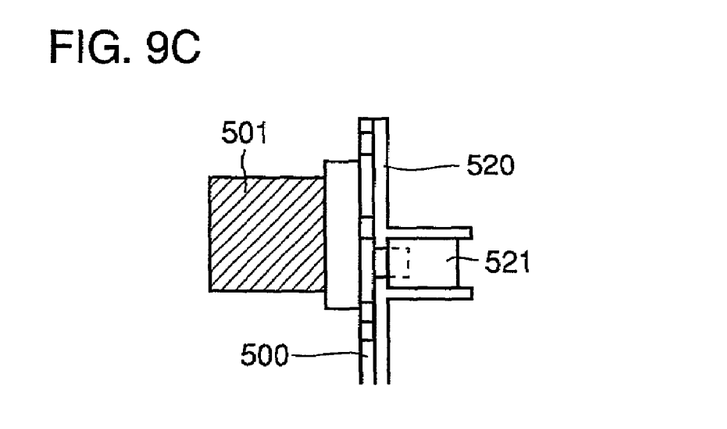

FIGS. 9A to 9C represent main portions of the F type connector attaching portion. In the periphery of the F type connector, the conventional shield case was not fit with the shield lid. In the embodiment shown in FIG. 9A, a grounding piece 521 is formed on shield lid 520, and cut-out bending 511 is formed in shield case 500. By bringing the grounding piece 521 of shield lid 520 into pressure contact with the cut-out bending of shield case 500, the shield lid 520 can be fitted in the shield case 500. Thus, undesirable influence caused by external bus noise or the clock noise of the microprocessor can be reduced.

As described above, according to the embodiments of the present invention, as a variable gain amplifier is provided as an upstream circuit, the gain specified by DOCSIS can be easily set.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A cable modem tuner, comprising:
   a tuner circuit taking and amplifying a signal corresponding to a reception channel from input signals, and converting to an intermediate frequency signal of a first frequency band; and
   a down converter circuit receiving the intermediate frequency signal of said first frequency band from said tuner circuit, and selectively outputting an intermediate frequency signal of said first frequency band or a second frequency band lower than said first frequency band, wherein
   said down converter circuit includes
      a local oscillation circuit generating an oscillation signal corresponding to said second frequency band in a first mode in which the intermediate frequency signal of said second frequency band is output, and stopping generation of said oscillation signal in a second mode in which the intermediate frequency signal of said first frequency band is output,
      a mixer circuit for mixing the intermediate frequency signals of said first frequency band input to said down converter circuit with an output of said local oscillation circuit, and outputting an intermediate frequency signal of said second frequency band in said first mode and outputting an intermediate frequency signal of said first frequency band in said second mode, and
      a filter circuit receiving an output signal from said mixer circuit and passing a signal of a frequency corresponding to a set cut off frequency, wherein
   said local oscillation circuit includes
      an oscillation element oscillating at said second frequency band,
      a first bipolar transistor receiving at a base an output of said oscillation element,
      a first bias resistance coupled between the base of said first transistor and a first voltage node, and
      a second bias resistance connected between an emitter of said first bipolar transistor and a ground node; and
   said mixer circuit includes a second bipolar transistor connected at a base to said first voltage node, and receiving at the base an output of said oscillation element and the intermediate frequency signal of said first frequency band, and a third bias resistance connected between the base of said second bipolar transistor and a second voltage node supplying a voltage higher than said first voltage node.

2. The cable modem tuner according to claim 1, wherein said local oscillation circuit includes a switch element of which on/off is instructed externally, connected parallel to said oscillation element, said switch element turning on/off in said first and second modes, respectively.

3. The cable modem tuner according to claim 1, wherein said filter circuit and said bias resistance are mounted on one surface of a printed board, and said down converter circuit except for said second bias resistance is mounted on the other surface of the printed board.

* * * * *